(12) United States Patent
Lim (10) Patent No.: US 11,231,466 B2
(45) Date of Patent: Jan. 25, 2022

(54) APPARATUS AND METHOD FOR ESTIMATING A STATE OF CHARGE OF A BATTERY

(71) Applicant: LG CHEM, LTD., Seoul (KR)

(72) Inventor: Bo-Mi Lim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 237 days.

(21) Appl. No.: 16/483,163

(22) PCT Filed: Sep. 7, 2018

(86) PCT No.: PCT/KR2018/010492
§ 371 (c)(1),
(2) Date: Aug. 2, 2019

(87) PCT Pub. No.: WO2019/050330
PCT Pub. Date: Mar. 14, 2019

(65) Prior Publication Data
US 2020/0003841 A1   Jan. 2, 2020

(30) Foreign Application Priority Data

Sep. 7, 2017   (KR) .................. 10-2017-0114601

(51) Int. Cl.
*G01R 31/3828*   (2019.01)
*G01R 31/3842*   (2019.01)
(Continued)

(52) U.S. Cl.
CPC ....... *G01R 31/3828* (2019.01); *G01R 31/367* (2019.01); *G01R 31/387* (2019.01); *G01R 31/3842* (2019.01)

(58) Field of Classification Search
None
See application file for complete search history.

(56) References Cited

U.S. PATENT DOCUMENTS

2007/0299620 A1   12/2007   Yun et al.
2008/0150491 A1*  6/2008   Bergveld ........... G01R 31/3828
                                              320/139
(Continued)

FOREIGN PATENT DOCUMENTS

CN   102831100 A   12/2012
CN   106896324 A    6/2017
(Continued)

OTHER PUBLICATIONS

Da Costa Sonia Carina Lopes et al., "Battery State of Charge Estimation using Extended Kalman Filter", 2016 International Symposium on Power Electronics, Electrical Drives, Automation and Motion (SPEEDAM), IEEE, Jun. 22, 2016, pp. 1085-1092, XP032932257. DOI: 10.1109/SPEEDAM.2016.7525904 [retrieved on Jul. 28, 2016].

(Continued)

*Primary Examiner* — Brent A. Fairbanks
(74) *Attorney, Agent, or Firm* — Birch, Stewart, Kolasch & Birch, LLP (57) ABSTRACT

An apparatus for estimating a state of charge of a battery, including a sensing unit that measures each of a voltage and a current of the battery, a current integrating unit that calculates a current integration value for a predetermined period, based on the measured current, and a processor operably coupled to the sensing unit and the current integrating unit, the processor adjusts a value of a process noise covariance used by an extended Kalmann filter according to operation characteristics of the battery and estimates a state of charge of the battery based on the adjusted value of the process noise covariance.

10 Claims, 4 Drawing Sheets

(51) Int. Cl.
*G01R 31/387* (2019.01)
*G01R 31/367* (2019.01)

(56) References Cited

U.S. PATENT DOCUMENTS

| | | | |
|---|---|---|---|
| 2010/0045240 A1* | 2/2010 | Bergveld | G01R 31/367 |
| | | | 320/132 |
| 2014/0074416 A1* | 3/2014 | Park | G01R 31/367 |
| | | | 702/63 |
| 2014/0149058 A1 | 5/2014 | Moh | |
| 2014/0210418 A1 | 7/2014 | Wang et al. | |
| 2014/0214268 A1 | 7/2014 | Li et al. | |
| 2014/0244225 A1* | 8/2014 | Balasingam | G01R 31/3842 |
| | | | 703/2 |
| 2015/0231985 A1* | 8/2015 | Li | B60L 58/13 |
| | | | 320/134 |
| 2016/0049821 A1* | 2/2016 | Aridome | G01R 31/3648 |
| | | | 320/128 |
| 2016/0252583 A1 | 9/2016 | Joe | |
| 2016/0259011 A1 | 9/2016 | Joe | |
| 2016/0336765 A1* | 11/2016 | Trimboli | H02J 7/0021 |
| 2017/0199247 A1 | 7/2017 | Joe | |

FOREIGN PATENT DOCUMENTS

| | | |
|---|---|---|
| EP | 2 700 966 A1 | 2/2014 |
| JP | 2010-127729 A | 6/2010 |
| JP | 2014-182072 A | 9/2014 |
| JP | 2016-65828 A | 4/2016 |
| JP | 2017-15594 A | 1/2017 |
| JP | 2017-122622 A | 7/2017 |
| KR | 10-0804698 B1 | 2/2008 |
| KR | 10-2014-0066394 A | 6/2014 |
| KR | 10-2015-0043214 A | 4/2015 |
| KR | 10-2015-0043216 A | 4/2015 |
| KR | 10-1529515 B1 | 6/2015 |
| KR | 10-1767635 B1 | 8/2017 |

OTHER PUBLICATIONS

Extended European Search Report No. 18854350.8 dated Mar. 27, 2020.
International Search Report for PCT/KR2018/010492 dated Dec. 20, 2018.

* cited by examiner

APPARATUS AND METHOD FOR ESTIMATING A STATE OF CHARGE OF A BATTERY

TECHNICAL FIELD

The present disclosure relates to an apparatus and method for estimating a state of charge (SOC) of a battery, and more particularly, to an apparatus and method for adaptively estimating SOC of a battery by adjusting a parameter related to an extended Kalman filter according to an operating state of the battery.

The present application claims priority to Korean Patent Application No. 10-2017-0114601 filed on Sep. 7, 2017 in the Republic of Korea, the disclosures of which are incorporated herein by reference.

BACKGROUND ART

Recently, demands for portable electronic products, such as laptop computers, video cameras, portable phones, etc. have rapidly increased, and development of electric cars, batteries for energy storage, robots, and satellites, etc. has regularized, and thus studies on high performance batteries capable of repetitive charging and discharging are actively conducted.

Currently commercialized batteries include nickel cadmium batteries, nickel hydrogen batteries, nickel zinc batteries, lithium batteries, etc., and there among, the lithium batteries are in the limelight because the lithium batteries have almost no memory effect compared to a nickel-based battery and thus is free of being charged and discharged, has a very low self-discharge rate, and has high energy density.

One of parameters important in using and managing a battery is a state of charge (SOC). SOC is a parameter indicating a relative ratio of current capacity to maximum capacity indicating electric energy stored in the battery when the battery is fully charged, and may be expressed in a range of 0 to 1 or in a range of 0% to 100%.

A current integration model and an equivalent circuit model are typically used to estimate SOC of the battery.

The current integration model measures a current flowing through a battery by using a current sensor and estimates SOC of the battery based on a current integration value in which the measured current is accumulated over time. However, due to a measurement error of the current sensor, a difference occurs between the SOC estimated by using the current integration model and actual SOC, and such a difference increases over time.

The equivalent circuit model is designed to simulate electric operation characteristics of a battery. However, the battery has a non-linear characteristic according to an operating state, and it is very difficult to design the equivalent circuit model to perfectly simulate the non-linear characteristic of the battery.

In order to solve the above-described demerits of each of the current integration model and the equivalent circuit model, there exists a technology of estimating SOC of a battery by using an extended Kalman filter. The extended Kalman filter can estimate more accurate SOC by combining the current integration model and the equivalent circuit model than when only one of the current integration model and the equivalent circuit model is used. In other words, SOC of the battery may be estimated closer to the actual SOC.

In order to estimate SOC of the battery by using the extended Kalman filter, a value of at least one process noise covariance related to each of at least one state variable (for example, SOC, overpotential, or the like) is required. However, conventionally, a constant was assigned as the value of process noise covariance. Accordingly, the process noise covariance does not change regardless of operation characteristics or a usage environment of the battery.

DISCLOSURE

Technical Problem

The present disclosure is designed to solve the problems of the related art, and therefore the present disclosure is directed to providing an apparatus and method of adjusting a value of a process noise covariance used by an extended Kalman filter according to operation characteristics of a battery, and periodically estimating a state of charge (SOC) of the battery based on the adjusted value of the process noise covariance.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

Various embodiments of the present disclosure for achieving the above objects are as follows.

In one aspect of the present disclosure, there is provided an apparatus for estimating a state of charge of a battery, the apparatus including: a sensing unit configured to measure a voltage of the battery via a voltage sensor and measure a current of the battery via a current sensor; a current integrating unit configured to calculate a current integration value for a predetermined period, based on the measured current; and a processor operably coupled to the sensing unit and the current integrating unit. The processor is configured to: read out, from a memory, a first initial value related to a state of charge of the battery, a second initial value related to overpotential of the battery, and a third initial value related to an error covariance matrix of an extended Kalman filter. The processor is configured to assign the first initial value and the second initial value respectively to a first state variable and a second state variable of a first state equation of the extended Kalman filter. The processor is further configured to predict each of the first state variable and the second state variable based on the current integration value, by using the first state equation. The processor is further configured to determine a process noise covariance matrix of the extended Kalman filter, based on any one of the first initial value and the predicted first state variable. The processor is further configured to predict the error covariance matrix based on the third initial value and the determined process noise covariance matrix, by using a second state equation of the extended Kalman filter. The processor is further configured to determine a Kalman gain of the extended Kalman filter, based on the predicted error covariance matrix. The processor is further configured to correct each of the predicted first state variable and the predicted second state variable, based on the determined Kalman gain and the measured voltage.

Also, the processor may be configured to output a notification signal indicating at least one of the corrected first state variable and the corrected second state variable to an external apparatus.

Also, the processor may be configured to: set the first initial value to be the same as a value of the corrected first state variable; and set the second initial value to be the same as a value of the corrected second state variable.

Also, the processor may be configured to: correct the predicted error covariance matrix based on the determined Kalman gain; and set the third initial value to be the same as the corrected error covariance matrix.

Also, the sensing unit may be configured to further measure a temperature of the battery via a temperature measuring sensor. The processor may be further configured to: determine a plurality of circuit parameters related to an equivalent circuit model of the battery, based on the measured temperature; and predict the second state variable further based on the determined plurality of circuit parameters.

Also, the processor may be further configured to, when the first initial value is within a first section, assign a predetermined first value and a predetermined second value respectively to first process noise and second process noise of the process noise covariance matrix.

Also, the processor may be further configured to: convert an open circuit voltage curve indicating a relationship between SOC and an open circuit voltage of the battery to an open circuit voltage change rate curve indicating a relationship between SOC and a rate of change of the open circuit voltage of the battery. The processor may be further configured to set an SOC section, where the rate of change of the open circuit voltage is equal to or greater than a threshold value, as the first section, based on the open circuit voltage change rate curve. and set an SOC section, where the rate of change of the open circuit voltage is smaller than the threshold value, as a second section based on the open circuit voltage change rate curve.

According to an embodiment, the processor may be further configured to, when the first initial value is in the second section, assign a third value smaller than the first value to the first process noise and assign the second value to the second process noise.

According to another embodiment, the processor may be further configured to, when the first initial value is in the second section, assign the first value to the first process noise and assign a fourth value greater than the second value to the second process noise.

According to another embodiment, the processor may be further configured to, when the first initial value is in the second section, assign a fifth value smaller than the first value to the first process noise and assign a sixth value greater than the second value to the second process noise.

In another aspect of the present disclosure, there is also provided a battery pack including the apparatus for estimating a state of charge of a battery.

Advantageous Effects

According to at least one of embodiments of the present disclosure, a value of a process noise covariance used by an extended Kalman filter may be adjusted according to operation characteristics of a battery, and a state of charge (SOC) of the battery may be periodically estimated based on the adjusted value of the process noise covariance. Accordingly, SOC of the battery may be more accurately estimated compared to when the value of the process noise covariance is maintained to a specific constant.

Effects of the present disclosure are not limited by the effects described above, and other effects that are not mentioned will become apparent to one of ordinary skill in the art from the appended claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

MODE FOR DISCLOSURE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Also, in the description of the present disclosure, certain detailed explanations of related art or functions are omitted when it is deemed that they may unnecessarily obscure the essence of the disclosure.

Terms including ordinals, such as first, second, etc., are used for the purpose of distinguishing one of the various components from the rest, and are not used to define components by such terms.

Throughout the specification, when a portion "includes" a component, it is intended to indicate that another component may be further included instead of excluding the other component, unless otherwise indicated. Also, the term such as "control unit" herein denotes a unit of processing at least one function or operation, and may be embodied via hardware, software, or a combination of hardware and software.

In addition, throughout the specification, when a portion is "connected" to another portion, they may be not only "directly connected", but may also be "indirectly connected" with another device therebetween.

Figure 1:
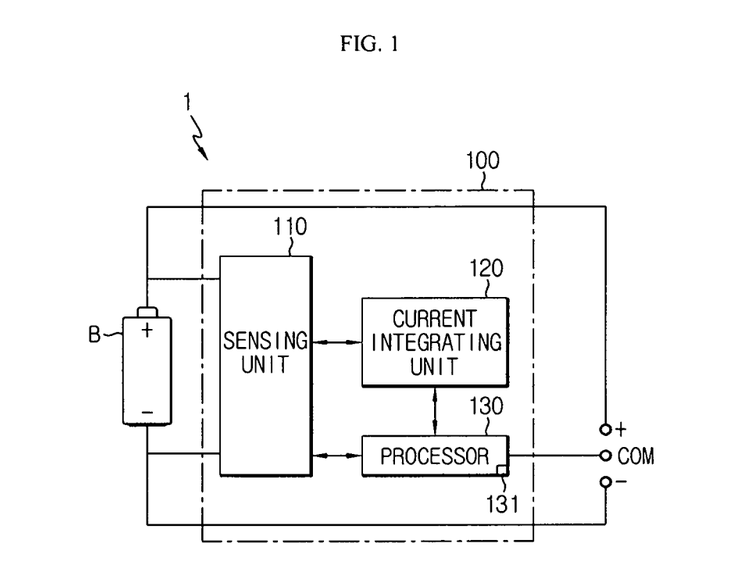
FIG. 1 is a schematic configuration diagram of a battery state of charge (SOC) estimating apparatus according to an embodiment of the present disclosure.
Figure 2:
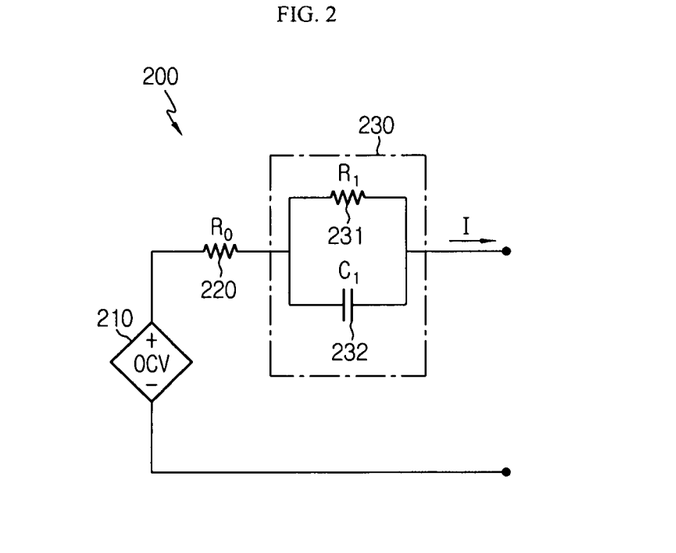
FIG. 2 illustrates an exemplary equivalent circuit model used by the battery SOC estimating apparatus of FIG. 1.

FIG. 1 is a schematic configuration diagram of an apparatus estimating a state of charge (SOC) of a battery according to an embodiment of the present disclosure, and FIG. 2 illustrates an exemplary equivalent circuit model used by the apparatus of FIG. 1.

Referring to FIG. 1, a battery pack 1 may include a battery B and an apparatus 100 for estimating a SOC of the battery B. The apparatus 100 includes a sensing unit 110, a current integrating unit 120, and a processor 130.

The sensing unit 110 is operably coupled to the current integrating unit 120 and the processor 130. In other words, the sensing unit 110 may be connected to the current integrating unit 120 and the processor 130 such as to transmit an electric signal to each of the current integrating unit 120 and the processor 130, or receive an electric signal from each of the current integrating unit 120 and the processor 130.

The sensing unit 110 may repeatedly measure a voltage applied between a positive electrode and a negative electrode of the battery B and a current flowing to or from the battery B every first predetermined period, and provide a signal indicating the measured voltage and current to at least one of the current integrating unit 120 and the processor 130.

The sensing unit 110 includes a current sensor configured to measure a current of the battery B. Also, the sensing unit 110 may further include a voltage sensor configured measure a voltage of the battery B. Also, the sensing unit 110 may further include a temperature sensor configured to measure a temperature of the battery B.

The current integrating unit 120 is operably combined to the sensing unit 110 and the processor 130. The current integrating unit 120 is configured to calculate a current integration value every second predetermined period. Here, a coulomb counter may be used as the current integrating unit 120. A unit of the current integration value may be 'ampere hour (Ah)'. Also, the second predetermined period may be a time equal to or longer than the first predetermined period. For example, the second predetermined period may be an integer multiple of the first predetermined period. Hereinafter, for convenience of description, it is assumed that the first predetermined period and the second predetermined period are the same.

In detail, the current integrating unit 120 may repeat, every second predetermined period, processes of calculating the current integration value for the second predetermined period, based on the current measured by the sensing unit 110 and transmitting a signal indicating the calculated current integration value to the processor 130.

In a current integration model, the current integration value and SOC may be defined as Equation 1 below.

$$SOC_{k+1} = SOC_k + \frac{I_k \Delta t}{Q_{max}} \qquad \langle \text{Equation 1} \rangle$$

In Equation 1, k used as a subscript indicates a time index and is a value increasing by 1 every second predetermined period. Also, SOC indicates a state of charge of the battery B, $\Delta t$ indicates a time length of the second predetermined period, and $Q_{max}$ indicates maximum capacity of the battery B.

The processor 130 is operably coupled to the sensing unit 110 and the current integrating unit 120. The processor 130 estimates SOC of the battery B based on an operating state of the battery B, which is indicated by a signal from each of the sensing unit 110 and the current integrating unit 120, by using an extended Kalman filter. Since the current integrating unit 120 calculates the current integration value every second predetermined period, the processor 130 may also estimate SOC of the battery B every second predetermined period. The processor 130 may transmit a message indicating the estimated SOC to an external apparatus (for example, ECU, a display, or the like of a vehicle) through a communication terminal COM.

The processor 130 may selectively include an application-specific integrated circuit (ASIC), another chipset, a logic circuit, a register, a communication modem, a data processing apparatus, etc., which are known in the related art, to execute various control logics. At least one of the various control logics executable by the processor 130 may be combined, and the combined control logics may be prepared in a computer-readable code system and recorded in a computer-readable recording medium. A type of the recording medium is not specifically limited as long as the recording medium is accessible by the processor 130 included in a computer. For example, the recording medium includes at least one selected from the group consisting of ROM, RAM, a register, CD-ROM, a magnetic tape, a hard disk, a floppy disk, and an optical data recording apparatus. Also, the code system may be modulated with a carrier signal and included in a communication carrier at a certain point in time, and distributed and stored in a networked computer. Also, functional programs, codes, and code segments for implementing the combined control logics may be easily inferred by programmers skilled in the art to which the present disclosure belongs.

A memory 131 may be embedded in the processor 130. A type of the memory 131 is not limited as long as the memory 131 is an information storage unit well-known to write, erase, update, and read out data. According to an embodiment, the memory may be DRAM, SDRAM, a flash memory, ROM, EEPROM, a register, or the like. The memory 131 may store program codes in which processes executable by the processor 130 are defined. In particular, the memory 131 pre-stores data defining each of a first state equation, a second state equation, a first observation equation, a second observation equation, a third observation equation, and an equivalent circuit model, which are required to execute the extended Kalman filter.

The processor 130 may repeatedly estimate SOC of the battery B over time by determining values of variables related to at least one of the first state equation, the second state equation, the first observation equation, the second observation equation, the third observation equation, and the equivalent circuit model, based on signals from the sensing unit 110 and the current integrating unit 120.

Here, the first state equation is used to predict SOC and overpotential of the battery B. The second state equation is used to predict an error covariance matrix. The first observation equation is used to determine a Kalman gain. The second observation equation is used to correct each of the SOC and overpotential predicted through the first state equation, based on the Kalman gain determined through the first observation equation. The third observation equation is used to correct the error covariance matrix predicted through the second state equation, based on the Kalman gain determined through the first observation equation.

Referring to FIG. 2, an equivalent circuit model 200 includes an open circuit voltage source 210, an internal resistor 220, and an RC circuit 230. As illustrated, the open circuit voltage source 210, the internal resistor 220, and the RC circuit 230 may be connected to each other in series.

The open circuit voltage source 210 simulates an open circuit voltage that is a voltage between the positive electrode and the negative electrode of the battery B, which is electrochemically stabilized for a long period of time (i.e., sufficiently), and has a nonlinear functional relation with SOC of the battery B. In other words, OCV=$f_1$(SOC) and SOC=$f_2$(OCV), wherein $f_1$ and $f_2$ indicate different functions.

The open circuit voltage formed by the open circuit voltage source 210 may be pre-defined based on various SOCs and temperatures via prior experiments.

In other words, a change of the open circuit voltage according to SOC of the battery B may be measured for each of a plurality of predetermined temperatures, and data indicating a relationship between the SOC of the battery B and the open circuit voltage may be pre-stored in the memory 131 in a form of a lookup table. For example, when there are m temperature values used in the prior experiments, a lookup table indicating m OCV-SOC curves may be pre-stored in the memory 131.

The internal resistor 220 simulates IR drop of the battery B. The IR drop denotes a voltage drop that is an instantaneous change of a voltage at both ends of the battery B when the battery B is charged or discharged. Due to the IR drop, a voltage measured at a point of time when charging of the battery B in a no-load state is started is greater than the open circuit voltage. On the other hand, a voltage measured at a point of time when discharging of the battery B in the no-load state is started is smaller than the open circuit voltage. A resistance $R_0$ of the internal resistor 220 may also be set differently for each of the plurality of predetermined temperatures via the prior experiments.

The RC circuit 230 simulates overpotential derived by an electric double layer or the like of the battery B, and includes a resistor 231 and a capacitor 232, which are connected to each other in parallel. $R_1$ indicates a resistance of the resistor 231 and $C_1$ indicates capacitance of the capacitor 232. The overpotential may be referred to as a polarization voltage. Each of $R_1$ and $C_1$ may be pre-set differently for each of the plurality of predetermined temperatures via the prior experiments.

In the equivalent circuit model 200, the overpotential may be defined as Equation 2 below.

$$Vop_{k+1} = Vop_k \left\{ \exp\left(-\frac{\Delta t}{R_1 C_1}\right) \right\} + R_1 \left\{ 1 - \exp\left(-\frac{\Delta t}{R_1 C_1}\right) \right\} I_K \qquad \langle \text{Equation 2} \rangle$$

In Equation 2, a symbol k used as a subscript indicates a time index, and is a value increasing by 1 every second predetermined period. Also, Vop indicates the overpotential, I indicates the current measured by the sensing unit 110, $\Delta t$ indicates the length of the second predetermined period, $R_1$ indicates the resistance of the resistor 231, and $C_1$ indicates the capacitance of the capacitor 232.

The processor 130 may determine the open circuit voltage that is one of parameters related to the equivalent circuit model 200 by referring to data pre-stored in the memory 131, based on pre-estimated SOC and the temperature of the battery B measured by the sensing unit 110, every second predetermined period.

The processor 130 may determine the resistance $R_0$ of the internal resistor 220, the resistance $R_1$ of the resistor 231, and the capacitance $C_1$ of the capacitor 232, which are a plurality of other circuit parameters related to the equivalent circuit model 200, by referring to the data pre-stored in the memory 131 based on the temperature of the battery B measured by the sensing unit 110 every second predetermined period.

The first state equation may be derived based on a combination of the current integration model and the equivalent circuit model 200, and may be represented by Equation 3 below.

$$\hat{x}_k^- = A\hat{x}_{k-1} + Bu_k \qquad \langle \text{Equation 3} \rangle$$

$$\rightarrow \hat{x}_{k-1} = \begin{bmatrix} a \\ b \end{bmatrix}$$

$$\rightarrow A = \begin{bmatrix} 1 & 0 \\ 0 & \exp\left(-\frac{\Delta t}{R_1 C_1}\right) \end{bmatrix}$$

$$\rightarrow u_k = I_k$$

$$\rightarrow B = \begin{bmatrix} \frac{\Delta t}{Q_{max}} \\ R_1\left(1 - \exp\left(-\frac{\Delta t}{R_1 C_1}\right)\right) \end{bmatrix}$$

In Equation 3, A and B are different system matrices of the extended Kalman filter, and may each have only fixed components. Also, the sign k used as a subscript denotes the time index and is a value increasing by 1 every second predetermined period. Also, a indicates a first state variable, b indicates a second state variable, I indicates the current measured by the sensing unit 110, $R_1$ indicates the resistance of the resistor 231, $C_1$ indicates the capacitance of the capacitor 232, $\Delta t$ indicates the time length of the second predetermined period, and $Q_{max}$ indicates the maximum capacity of the battery B.

The processor 130 reads the first initial value related to SOC of the battery B and the second initial value related to the overpotential of the battery B from the memory 131. The processor 130 assigns the first initial value to the first state variable a and assigns the second initial value to the second state variable b. Here, the first initial value indicates previous SOC that is SOC estimated when the time index is k−1. Also, the second initial value indicates previous overpotential that is overpotential estimated when the time index is k−1. Also, a sign ^ used as a superscript is a sign indicating a value predicted by the extended Kalman filter, and a sign − used as a superscript is a sign indicating a value before being corrected by the extended Kalman filter.

When k−1=0, two predetermined values may be respectively input to the first state variable a and the second state variable b.

As shown in Equation 3, the processor 130 may calculate $\hat{x}_k^-$ including prediction values of the first state variable and the second state variable, based on the current integration value $\Delta t \times I_k$, by using the first state equation. In other words, SOC and overpotential when the time index is k may be predicted respectively from SOC and overpotential pre-estimated from the time index k−1.

The second state equation may be represented as Equation 4 below.

$$P_k^- = AP_{k-1}A^T + Q_k \qquad \langle \text{Equation 4} \rangle$$

$$\rightarrow Q_k = \begin{bmatrix} M_k^2 & 0 \\ 0 & N_k^2 \end{bmatrix}.$$

In Equation 4, the sign k used as a subscript denotes the time index and is a value increasing by 1 every second predetermined period. Also, P indicates the error covariance matrix, Q indicates the process noise covariance matrix, $M_k^2$ indicates the covariance of process noise related to SOC, $N_k^2$ indicates the covariance of process noise related to overpotential, and T indicates a transposed matrix operator. In other words, $A^T$ denotes a transposed matrix of A. The sign − used as a superscript is a sign indicating the value before being corrected by the extended Kalman filter. When k−1=0, a predetermined value may be input to $P_{k-1}$.

The processor 130 may read out the third initial value related to the error covariance matrix of the extended Kalman filter from the memory 131. The third initial value indicates $P_{k-1}$ that is a previous error covariance matrix previously corrected at the time index k−1.

As shown in Equation 4, the processor 130 may predict the error covariance matrix based on the previous error covariance matrix $P_{k-1}$ and the process noise covariance matrix $Q_k$, by using the second state equation. In other words, the error covariance matrix $P^-_k$ when the time index is k may be predicted based on the error covariance matrix $P_{k-1}$ previously corrected at the time index k−1 and the process noise covariance matrix $Q_k$ determined when the time index is k.

The processor 130 may determine the process noise covariance matrix $Q_k$ based on any one of the first initial value and the first state variable predicted through the first state equation. Here, the determining of the process noise covariance matrix may denote determining $M_k^2$ and $N_k^2$. Operations of the processor 130 determining $M_k^2$ and $N_k^2$ will be described separately below with reference to FIG. 4.

The first observation equation may be represented as Equation 5 below.

$$K_k = P^-_k H^T (H P^-_k H^T + R)^{-1} \qquad \text{<Equation 5>}$$

In Equation 5, H is a system matrix different from A and B, and may have only fixed components. Also, K denotes the Kalman gain and R denotes a measurement noise covariance matrix. The processor 130 determines the Kalman gain based on the error covariance matrix predicted through the second state equation, by using the first observation equation.

The second observation equation may be represented as Equation 6 below.

$$\hat{x}_k = \hat{x}^-_k + K_k(z_k - H\hat{x}^-_k) \qquad \text{<Equation 6>}$$

In Equation 6, $z_k$ denotes the voltage across the battery B measured by the sensing unit 110. $H\hat{x}^-_k$ may be a prediction value of the voltage of the battery B. The processor 130 may correct each of the first and second state variables predicted through the first state equation, based on the Kalman gain determined through the first observation equation and the voltage measured by the sensing unit 110.

Describing Equation 6 in further detail, the matrix $\hat{x}_k$ including the corrected first and second state variables may be calculated by adding a value obtained by multiplying $K_k$ by a difference between $z_k$ and $H\hat{x}^-_k$ to the matrix $\hat{x}_k$ including the predicted first and second state variables.

By calculating the corrected first and second state variables, the estimation of SOC in $k^{th}$ period may be completed. In other words, the first state variable corrected at the time index k may be set as the estimation value of SOC of the battery B. The processor 130 may set the first initial value pre-stored in the memory 131 to be the same as a value of the corrected first state variable. Also, the processor 130 may set the second initial value pre-stored in the memory 131 to be the same as a value of the corrected second state variable.

In other words, the processor 130 may update each of the first and second initial values to a new value.

The processor 130 may output a notification signal indicating at least one of the first and second state variables corrected through the second observation equation to an external apparatus (for example, a display or MCU of an electric car), through a communication channel. The communication channel supports wired or wireless communication. The wired communication may be, for example, controller area network (CAN) communication, and the wireless communication may be, for example, Zigbee or Bluetooth communication.

The third observation equation may be represented as Equation 7 below.

$$P_k = (E - K_k H) P^-_k \qquad \text{<Equation 7>}$$

In Equation 7, E denotes a unit matrix. The processor 130 may correct the predicted error covariance matrix $P^-_k$ based on the error covariance matrix $P^-_k$ predicted through the second state equation and the Kalman gain $K_k$ determined through the first observation equation. The processor 130 may set $P_{k-1}$ pre-stored in the memory 131 to be the same as $P_k$. In other words, the processor 130 may update the third initial value from $P_{k-1}$ to $P_k$.

Figure 3:
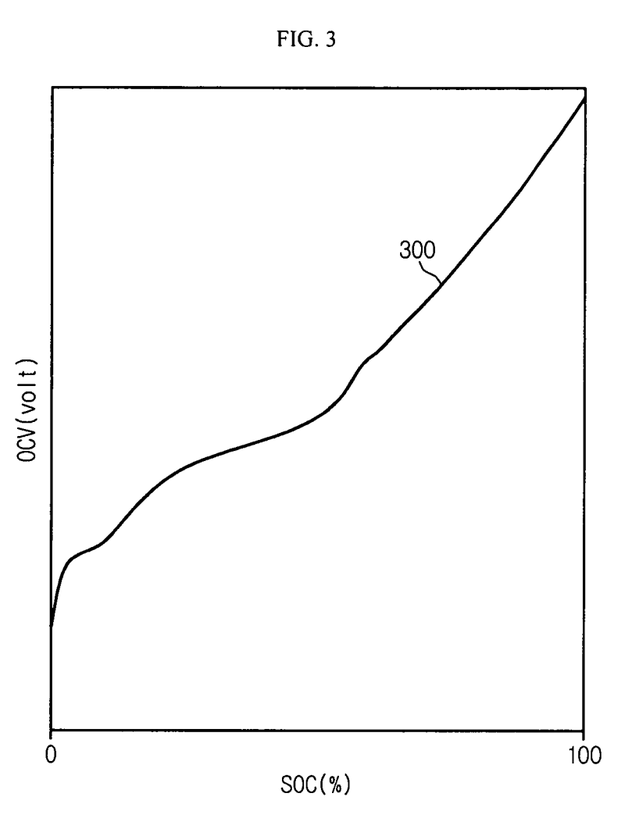
FIG. 3 is a graph showing an exemplary open circuit voltage curve showing a relationship between SOC of a battery and an open circuit voltage.
Figure 4:
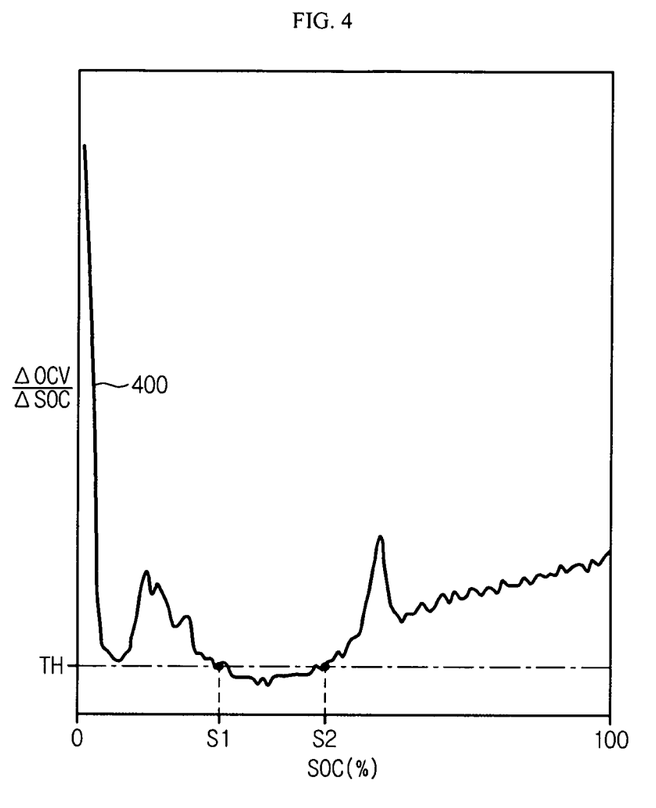
FIG. 4 is a graph showing an exemplary open circuit voltage change rate curve showing a relationship between SOC of a battery and a rate of change of an open circuit voltage.

FIG. 3 is a graph showing an exemplary open circuit voltage curve 300 showing a relationship between SOC and the open circuit voltage of the battery B, and FIG. 4 is a graph showing an exemplary open circuit voltage change rate curve 400 showing a relationship between SOC and the rate of change of the open circuit voltage of the battery B.

First, referring to the open circuit voltage curve 300 of FIG. 3, a change of the open circuit voltage recorded in an SOC range of 0% to 100%, in an environment where the temperature of the battery B is maintained at a specific value (for example, 30° C.), is shown. As easily understood, when SOC increases from 0% to 100%, the open circuit voltage non-linearly increases. On the other hand, when SOC decreases from 100% to 0%, the open circuit voltage non-linearly decreases.

Referring now to FIG. 4, the open circuit voltage change rate curve 400 associated with the open circuit voltage curve 300 of FIG. 3 is illustrated. The processor 130 may convert the open circuit voltage curve 300 of FIG. 3 to the open circuit voltage change rate curve 400 of FIG. 4. The processor 130 repeats a process of calculating an open circuit voltage rate of change (i.e., ΔOCV/ΔSOC) indicating an increment ΔOCV of the open circuit voltage according to change of SOC by a predetermined rate ΔSOC (for example, 1%) from 0% to 100%, thereby obtaining the open circuit voltage change rate curve 400 from the open circuit voltage curve 300.

When the open circuit voltage change rate curve 400 is obtained, the processor 130 may set each of a first section (i.e., first range) and a second section (i.e., second range) within the SOC range of 0% to 100%, based on the open circuit voltage change rate curve 400. The first section is a SOC range where the open circuit voltage rate of change is equal to or greater than a threshold value TH. In FIG. 4, 0% to S1% and S2% to 100% may be set as the first section. The second section is a SOC range of where the open circuit voltage rate of change is smaller than the threshold value TH, unlike the first section. In FIG. 4, S1% to S2% may be set as the second section. Therefore, the first section and the second section do not overlap each other.

As the open circuit voltage rage of change decreases, the accuracy of $H\hat{x}^-_k$ related to the equivalent circuit model 200 is decreased. Accordingly, at least one of an operation of temporarily increasing the reliability of the current integration model and an operation of temporarily decreasing the reliability of the equivalent circuit model 200 needs to be performed based on the open circuit voltage rate of change.

When the first initial value a is in the first section, the processor 130 may assign a predetermined first value (for example, 0.1) and a predetermined second value (for example, 0.001) respectively to a first process noise covariance $M_k^2$ and a second process noise covariance $N_k^2$, which are two components of the process noise covariance matrix $Q_k$. The first value and the second value may be constants predetermined through prior experiments.

In contrast, when the first initial value a is in the second section instead of the first section, the processor 130 may replace at least one of the first value and the second value by another value. For example, the processor 130 may assign a third value (for example, 0.01) smaller than the first value to the first process noise covariance and assign the second value to the second process noise covariance. As another example, the processor 130 may assign the first value to the first process noise covariance and assign a fourth value (for example, 0.005) greater than the second value to the second process noise covariance. As another example, the processor 130 may assign a fifth value (for example, 0.05) smaller than the first value to the first process noise covariance and assign a sixth value (for example, 0.01) greater than the second value to the second process noise covariance. Here, a difference between the first value and the third value and a difference between the first value and the fifth value may be proportional to a difference between the threshold value TH and the open circuit voltage rate of change. Also, a difference between the second value and the fourth value and a difference between the second value and the sixth value may also be proportional to the difference between the threshold value TH and the open circuit voltage rate of change.

As described above, the processor 130 increases a ratio of the second process noise covariance to the first process noise covariance when the first initial value a is in the second section compared to when the first initial value a is in the first section. As a result, in estimating SOC of the battery B, when the first initial value a is in the second section, the reliability (i.e. influence) of the equivalent circuit model 200 is relatively decreased and the reliability of the current integration model is relatively increased.

Figure 5:
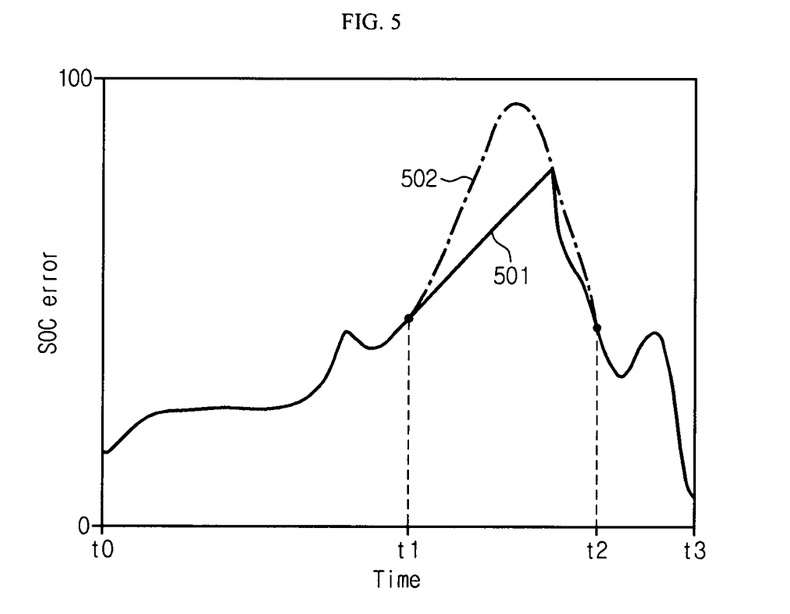
FIG. 5 is a graph showing a difference between when components of a process noise covariance matrix of an extended Kalman filter are adjusted and when not adjusted, according to an embodiment of the present disclosure.

FIG. 5 is a graph showing a difference between when components of a process noise covariance matrix of an extended Kalman filter are adjusted and when not adjusted, according to an embodiment of the present disclosure.

Referring to FIG. 5, a result of recording an error of SOC estimated by the extended Kalman filter with respect to actual SOC over time is illustrated while discharging the battery B of SOC 100% to SOC 0% at a uniform speed. In FIG. 5, a first curve 501 is obtained by recording, over time, an error of SOC estimated by the extended Kalman filter in which two components $M_k^2$, $N_k^2$ of the process noise covariance matrix $Q_k$ are adjusted according to the first initial value updated whenever the time index k is increased by 1. A second curve 502 is obtained by recording, over time, an error of SOC estimated by the extended Kalman filter in which the two components of the process noise covariance matrix are respectively fixed to the first value and the second value.

Here, to indicates a point of time when actual SOC is 100%, t1 indicates a point of time when actual SOC is S1%, t2 denotes a point of time when actual SOC is S2%, and t3 denotes a point of time when actual SOC is 0%.

As shown in FIG. 5, the first curve 501 and the second curve 502 match each other from t0 to t1. Also, the first curve 501 is below the second curve 502 from t1 to t2. Also, the first curve 501 and the second curve 502 match each other from t2 to t3. This supports that during a period from t1 to t2 where the open circuit voltage rate of change is maintained to be smaller than the threshold value, an error of an estimated SOC with respect to actual SOC is decreased when at least one of the two components $M_k^2$, $N_k^2$ of the process noise covariance matrix $Q_k$ of the extended Kalman filter is adjusted.

Embodiments of the present disclosure described above are not embodied only through an apparatus and a method, but may be embodied through a program realizing a function corresponding to a feature of the embodiments of the present disclosure or a recording medium having recorded thereon the program, and such embodiments may be easily embodied by experts of technical fields to which the present disclosure belongs, from the description of the embodiments described above.

The present disclosure has been described by limited embodiments and drawings, but the present disclosure is not limited thereto, and various changes and modifications are possible within the scope of the disclosure and the equivalent range of appended claims by one of ordinary skill in the art.

Also, since the present disclosure described above may be variously substituted, modified, and changed by one of ordinary skill in the art within the range of the technical ideas of the present disclosure, the present disclosure is not limited by the above-described embodiments and appended drawings, but all or some of the embodiments may be selectively combined for various modifications.

What is claimed is:

1. An apparatus for estimating a state of charge of a battery, the apparatus comprising:
a sensing unit including a voltage sensor and a current sensor, the sensing unit being configured to:
measure a voltage of the battery via the voltage sensor, and
measure a current of the battery via the current sensor;
a current integrating unit is a coulomb counter configured to calculate a current integration value for a predetermined period, based on the measured current; and
a processor operably coupled to the sensing unit and the current integrating unit, the processor includes a chipset, wherein the processor is configured to:
read out, from a memory, a first initial value representing a previously estimated state of charge of the battery, a second initial value representing a previously estimated overpotential of the battery, and a third initial value representing a previously estimated error covariance matrix of an extended Kalman filter;
assign the first initial value and the second initial value respectively to a first state variable and a second state variable of a first state equation of the extended Kalman filter;
predict a next value of the first state variable and predict a next value of the second state variable based on the current integration value, by using the first state equation;
determine a process noise covariance matrix of the extended Kalman filter, based on any one of the first initial value and the predicted first state variable;

predict the error covariance matrix based on the third initial value and the determined process noise covariance matrix, by using a second state equation of the extended Kalman filter;
determine a Kalman gain of the extended Kalman filter, based on the predicted error covariance matrix; and
correct each of the predicted first state variable and the predicted second state variable, based on the determined Kalman gain and the measured voltage,
wherein the processor is further configured to:
convert an open circuit voltage curve indicating a relationship between a SOC and an open circuit voltage of the battery to an open circuit voltage change rate curve indicating a relationship between the SOC and a rate of change of the open circuit voltage of the battery;
when the first initial value is within a first section, assign a predetermined first value and a predetermined second value respectively to a first process noise and to a second process noise of the determined process noise covariance matrix, the first section is a first SOC range where the rate of change of the open circuit voltage is equal to or greater than a threshold value;
set a second section, the second section is a second SOC range, separate from the first SOC range of the first section, where the rate of change of the open circuit voltage is smaller than the threshold value; and
when the first initial value is in the second section, assign a third value smaller than the first value to the first process noise and assign the second value to the second process noise.

2. The apparatus of claim 1, wherein the processor is further configured to output a notification signal indicating at least one of the corrected first state variable and the corrected second state variable to an external apparatus.

3. The apparatus of claim 1, wherein the processor is configured to:
update the first initial value to be the same as a value of the corrected first state variable; and
update the second initial value to be the same as a value of the corrected second state variable.

4. The apparatus of claim 1, wherein the processor is configured to:
correct the predicted error covariance matrix based on the determined Kalman gain; and
update the third initial value to be the same as the corrected error covariance matrix.

5. The apparatus of claim 1, wherein the sensing unit is further configured to measure a temperature of the battery via a temperature measuring sensor, and
the processor is further configured to:
determine a plurality of circuit parameters related to an equivalent circuit model of the battery, based on the measured temperature; and
predict the second state variable further based on the determined plurality of circuit parameters.

6. A battery pack comprising the apparatus for estimating a state of charge of a battery of claim 1.

7. An apparatus for estimating a state of charge of a battery, the apparatus comprising:
a sensing unit configured to:
measure a voltage of the battery via a voltage sensor of the sensing unit; and
measure a current of the battery via a current sensor of the sensing unit;
a current integrating unit is a coulomb counter configured to calculate a current integration value for a predetermined period, based on the measured current; and
a processor operably coupled to the sensing unit and the current integrating unit, the processor includes a chipset, wherein the processor is configured to: read out, from a memory, a first initial value representing a previously estimated state of charge of the battery, a second initial value representing a previously estimated overpotential of the battery, and a third initial value representing a previously estimated error covariance matrix of an extended Kalman filter;
assign the first initial value and the second initial value respectively to a first state variable and a second state variable of a first state equation of the extended Kalman filter;
predict a next value of the first state variable and predict a next value of the second state variable based on the current integration value, by using the first state equation;
determine a process noise covariance matrix of the extended Kalman filter, based on any one of the first initial value and the predicted first state variable;
predict the error covariance matrix based on the third initial value and the determined process noise covariance matrix, by using a second state equation of the extended Kalman filter;
determine a Kalman gain of the extended Kalman filter, based on the predicted error covariance matrix; and
correct each of the predicted first state variable and the predicted second state variable, based on the determined Kalman gain and the measured voltage,
wherein the processor is further configured to:
convert an open circuit voltage curve indicating a relationship between a SOC and an open circuit voltage of the battery to an open circuit voltage change rate curve indicating a relationship between the SOC and a rate of change of the open circuit voltage of the battery;
when the first initial value is within a first section, assign a predetermined first value and a predetermined second value respectively to a first process noise and to a second process noise of the determined process noise covariance matrix, the first section is a first SOC range where the rate of change of the open circuit voltage is equal to or greater than a threshold value;
set a second section, the second section is a second SOC range, separate from the first SOC range of the first section, where the rate of change of the open circuit voltage is smaller than the threshold value, and
wherein the processor is further configured to, when the first initial value is in the second section, assign the first value to the first process noise and assign a fourth value greater than the second value to the second process noise.

8. A battery pack comprising the apparatus for estimating a state of charge of a battery of claim 7.

9. An apparatus for estimating a state of charge of a battery, the apparatus comprising:
a sensing unit configured to:
measure a voltage of the battery via a voltage sensor of the sensing unit, and
measure a current of the battery via a current sensor of the sensing unit;
a current integrating unit is a coulomb counter configured to calculate a current integration value for a predetermined period, based on the measured current; and
a processor operably coupled to the sensing unit and the current integrating unit, the processor includes a chipset, wherein the processor is configured to:
read out, from a memory, a first initial value representing a previously estimated state of charge of the battery, a second initial value representing a previously estimated overpotential of the battery, and a third initial value representing a previously estimated error covariance matrix of an extended Kalman filter;
assign the first initial value and the second initial value respectively to a first state variable and a second state variable of a first state equation of the extended Kalman filter;
predict a next value of the first state variable and predict a next value of the second state variable based on the current integration value, by using the first state equation;
determine a process noise covariance matrix of the extended Kalman filter, based on any one of the first initial value and the predicted first state variable;
predict the error covariance matrix based on the third initial value and the determined process noise covariance matrix, by using a second state equation of the extended Kalman filter;
determine a Kalman gain of the extended Kalman filter, based on the predicted error covariance matrix; and
correct each of the predicted first state variable and the predicted second state variable, based on the determined Kalman gain and the measured voltage, wherein the processor is further configured to:
convert an open circuit voltage curve indicating a relationship between a SOC and an open circuit voltage of the battery to an open circuit voltage change rate curve indicating a relationship between the SOC and a rate of change of the open circuit voltage of the battery;
when the first initial value is within a first section, assign a predetermined first value and a predetermined second value respectively to a first process noise and to a second process noise of the determined process noise covariance matrix, the first section is a first SOC range where the rate of change of the open circuit voltage is equal to or greater than a threshold value;
set a second section, the second section is a second SOC range, separate from the first SOC range of the first section, where the rate of change of the open circuit voltage is smaller than the threshold value; and
wherein the processor is further configured to, when the first initial value is in the second section, assign a fifth value smaller than the first value to the first process noise and assign a sixth value greater than the second value to the second process noise.

10. A battery pack comprising the apparatus for estimating a state of charge of a battery of claim 9.

* * * * *